United States Patent [19]

La Rosa

[11] Patent Number: 6,072,727
[45] Date of Patent: Jun. 6, 2000

[54] DYNAMIC SENSE AMPLIFIER FOR EPROM, EEPROM AND FLASH-EPROM MEMORY DEVICES

[75] Inventor: Francesco La Rosa, Catania, Italy

[73] Assignee: STMicroelectronics S.r.l., Agrate Brianza, Italy

[21] Appl. No.: 09/070,105

[22] Filed: Apr. 29, 1998

[30] Foreign Application Priority Data

Apr. 30, 1997 [IT] Italy ................................. MI97A1005

[51] Int. Cl.[7] ................................................ G11C 16/04
[52] U.S. Cl. .............................. 365/189.01; 365/189.06; 365/189.07
[58] Field of Search ........................ 365/189.01, 189.05, 365/189.06, 189.07, 203, 207

[56] References Cited

U.S. PATENT DOCUMENTS 5,325,331  6/1994  Parkinson et al. ................. 365/189.06
5,764,572  6/1998  Hammick ........................... 365/189.01

*Primary Examiner*—David Nelms
*Assistant Examiner*—David Lam
*Attorney, Agent, or Firm*—Theodore E. Galanthay; Robert Iannucci; Seed IP Law Group PLLC

[57] ABSTRACT

The invention relates to a dynamic sense amplifier, particularly for semiconductor memory devices of the EPROM, EEPROM and Flash-EPROM types, which includes a virtual ground sense circuit having a pair of output nodes, an equilibration device for equalizing the voltages at the output nodes, and respective reference and matrix circuit legs associated with the output nodes and being led to respective input terminals, the sense amplifier also includes a bias circuit portion for biasing the input terminals. The inventive amplifier distinguishes itself in that the sense circuit and equilibration device are driven by respective signals to generate a predetermined differential voltage between the output nodes before the sense circuit is activated.

16 Claims, 8 Drawing Sheets

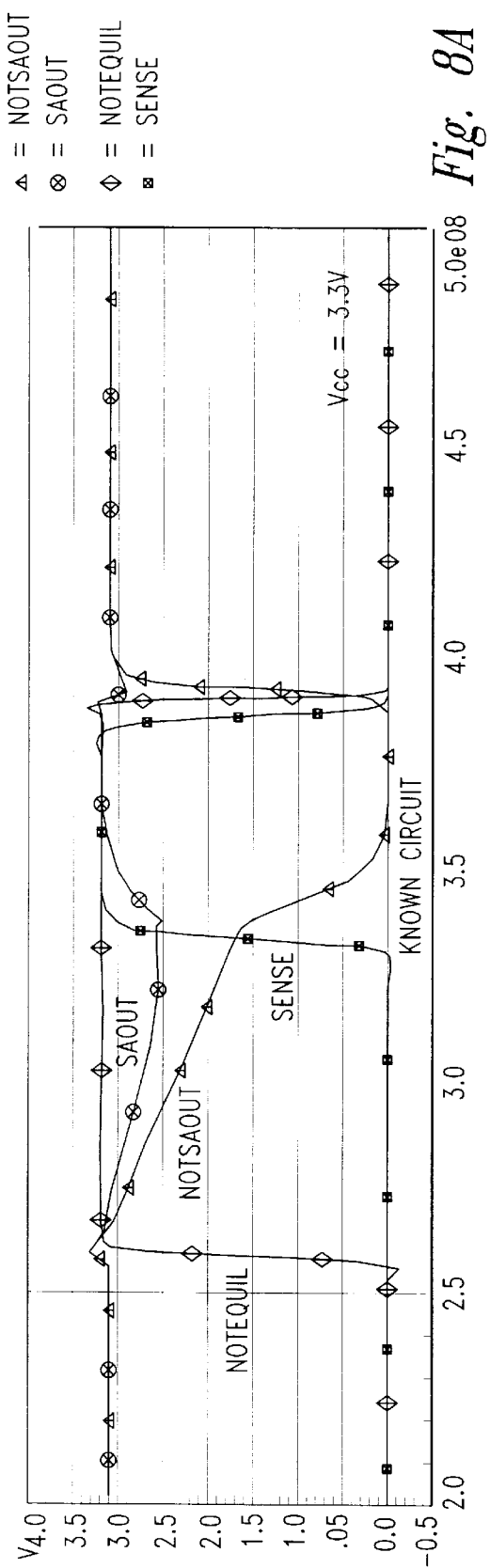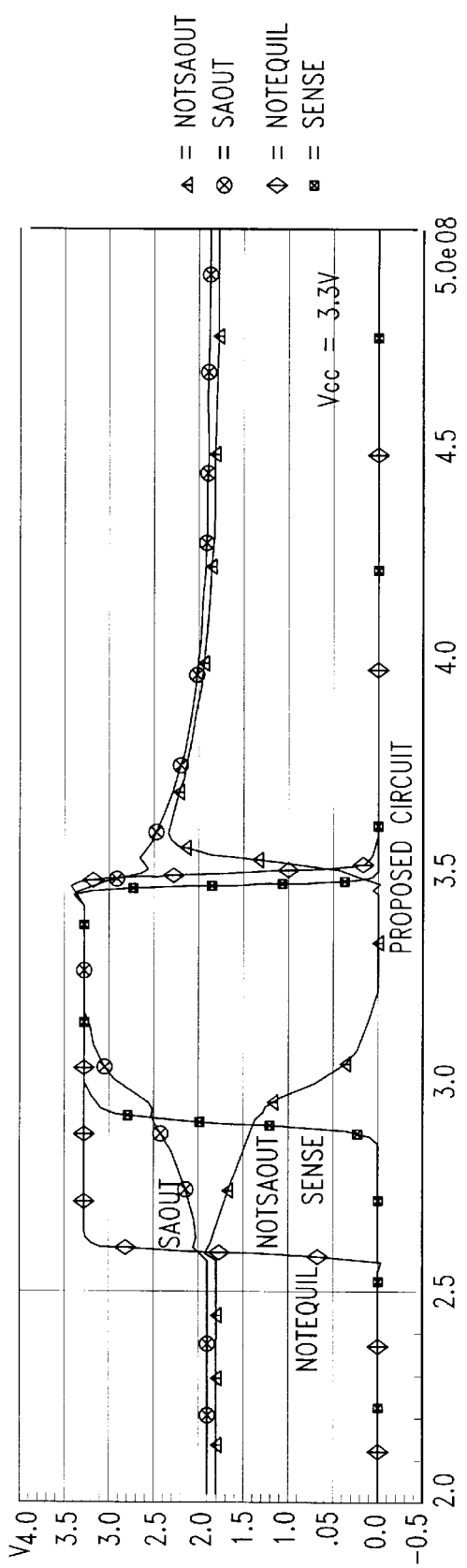

DYNAMIC SENSE AMPLIFIER FOR EPROM, EEPROM AND FLASH-EPROM MEMORY DEVICES

TECHNICAL FIELD

This invention relates to a dynamic sense amplifier for semiconductor memory devices of the EPROM, EEPROM and Flash EPROM types.

More particularly, the invention relates to a dynamic sense amplifier which comprises a virtual ground sense circuit having a pair of output nodes; an equilibration device for equalizing the potentials present on the nodes; respective reference and matrix circuit legs associated with the output nodes and led to respective input terminals; and a circuit portion for biasing the input terminals.

BACKGROUND OF THE INVENTION

As is well known, electronic non-volatile memory circuits integrated in a semiconductor require that a circuit device be provided to sense, i.e., "read" the data from the memory cells. This device that converts the analog data to digital data is called a "sense amplifier".

Sense amplifiers of the static type are known. However, superior performance is provided by sense amplifiers of the dynamic type, this term indicating the presence, inside the amplifier, of a latch memory element to hold the data after it has been read.

A typical example of a dynamic sense amplifier for non-volatile memories of the Flash EPROM type is described in European Patent Application No. 0 713 222, herein incorporated by reference. The sense amplifier described in that application comprises a differential amplifier type of basic structure, wherein a cell to be read from the memory matrix is compared to a reference cell.

The currents of the matrix cell and a reference current generator are compared in the amplifier by means of a current-to-voltage conversion which compares the voltages present on two respective nodes in the matrix leg and the reference leg.

The read cycle of a conventional amplifier of the type described in the aforementioned European Application can be divided into three phases:

equilibration and precharging;

integration; and sensing.

The precharge phase requires specially provided precharge circuitry 142, functional to charge the output nodes of the amplifier to a predetermined value of potential. The provision of this circuitry burdens the amplifier structure. In addition, an input equilibration circuit portion 144 is provided which becomes active at the start of the equilibration phase. Managing the operation of this circuit portion adds to the amplifier sensing time. Lastly, the current-to-voltage conversion phase is provided by an integration of the difference between the matrix and reference currents. This produces noise on the reference voltage used for impressing a bit-line voltage on the columns of the memory matrix.

The present invention is aimed at improving the dynamic sense amplifiers disclosed in the aforementioned European Patent Application.

A prior technical solution that already improves on the performance of the above-described amplifier is illustrated in a second European Patent Application by this Applicant, EP 96830164.8, herein incorporated by reference. This second Application discloses a dynamic sense amplifier which comprises a sense circuit including a latch circuit portion and an equilibration device, as well as a bias circuit portion for biasing the input terminals of the matrix and reference legs of the differential amplifier.

Although in several ways advantageous, not even this second technical solution is destitute of drawbacks, as specified herein below.

With respect to the sensing circuit, this prior solution does not allow a significant differential voltage to be generated rapidly before the latch circuit portion is enabled. Regarding the bias circuit portion, two distinct negative feedback circuits are used to impress a voltage on each of the two amplifier inputs. This involves the use of two distinct control signals, Pcleft and Pcright. In addition, in this prior solution, the sense amplifier is controlled by a circuit generating a signal whose slope is modulated as a function of the conductivity of the memory cell.

Because of these drawbacks, the resulting sense amplifier is not particularly fast.

SUMMARY OF THE INVENTION

An embodiment of this invention provides a dynamic sense amplifier for semiconductor memory devices of the EPROM, EEPROM, and Flash EPROM types, which has such structural and functional features as to overcome the drawbacks mentioned above in connection with the prior art.

An embodiment of this invention utilizes an active circuit to generate a differential voltage across the output nodes of the sense amplifier during the compare phase of the matrix leg current and the reference leg current.

The sense amplifier includes a sense circuit and an equilibration device that are driven by respective signals to generate a predetermined differential voltage between said output nodes before the sense circuit is activated.

Features and advantages of the sense amplifier according to this invention will become apparent from the following description of an embodiment thereof, given by way of non-limitative example with reference to the accompanying drawings.

DETAILED DESCRIPTION OF THE INVENTION

Figure 1:
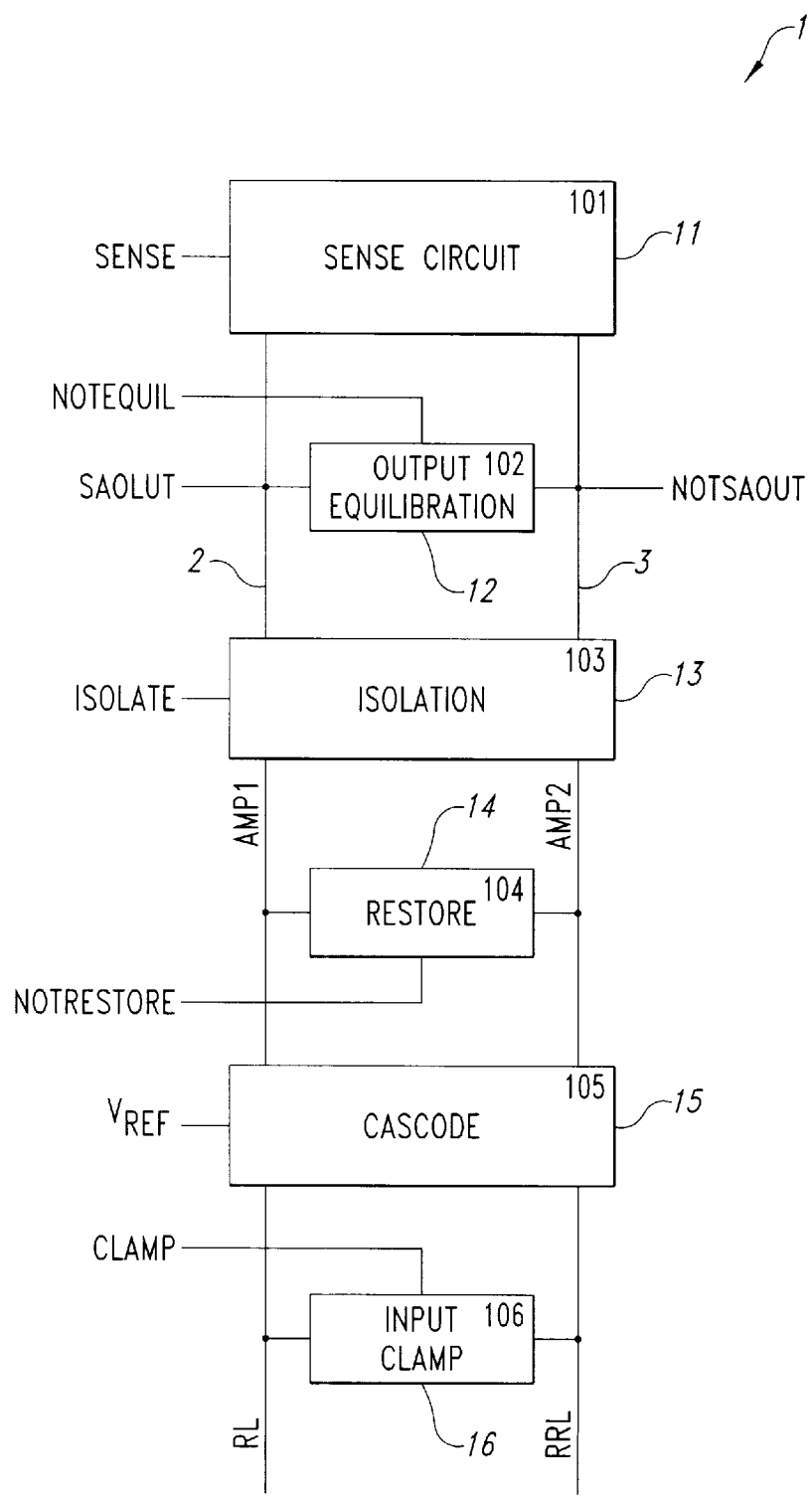
FIG. 1 shows schematically an embodiment of the sense amplifier according to the invention.

Referring to the drawing views, generally and schematically shown at 1 is a sense amplifier embodying this invention and intended for semiconductor memory devices such as EPROMs, EEPROMs and Flash EPROMs.

Figure 2:
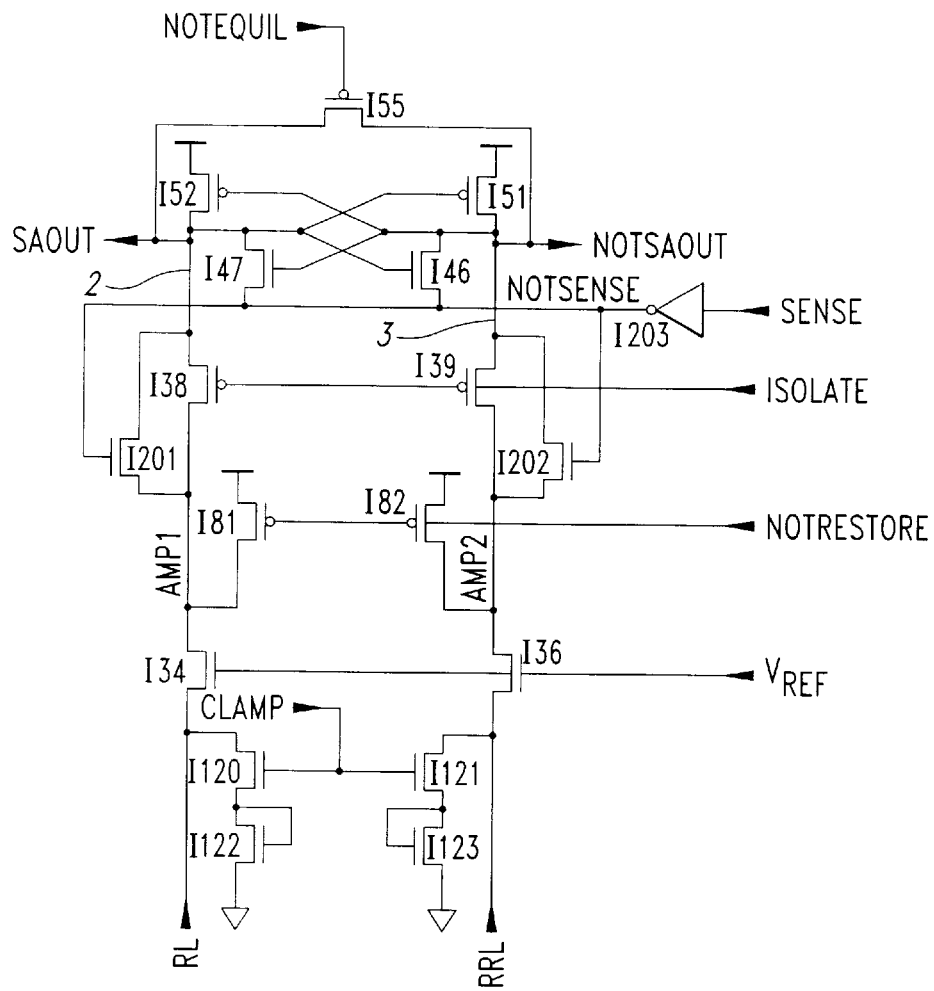
FIG. 2 shows in further detail the circuit structure of the amplifier in FIG. 1.

The amplifier 1 comprises a sense circuit 11 formed essentially of two pairs of cross-coupled PMOS and NMOS transistors. These transistors are indicated in FIG. 2 at 151 and I52, for the PMOS transistors, and at I46 and I47 for the NMOS transistors.

The circuit 11 is basically a virtual ground latch device wherein the first pair of PMOS transistors I51, I52 have their source terminals connected to a supply voltage reference Vdd. The circuit 11 plays an active role in the generation of a differential voltage that allows data to be read from the memory in accordance with the principle of this invention.

The drain terminal of the transistor I52 is connected to the drain terminal of the transistor I47, and to the true output node SAOUT. The gate terminal of the transistor I46 also is connected to this output node SAOUT.

The drain terminal of the transistor I51 is connected to the drain terminal of the transistor I46 and to an inverse output node NOTSAOUT. The gate terminal of the transistor I47 also is connected to this output node NOTSAOUT.

Both nodes, SAOUT and NOTSAOUT, are connected to the conduction terminals of a PMOS transistor I55 which functions as an equilibration transistor and generally corresponds to an equilibration device as shown within block 12, in FIG. 1. The gate terminal of this equilibration transistor receives a signal NOTEQUIL. The transistor I55 is active to perform an equilibration of the output nodes before the actual sensing phase.

The amplifier 1 structure further comprises two circuit legs 2 and 3 which are commonly known as the reference and matrix legs, respectively. These legs are also referenced AMP1 and AMP2. The free ends of these legs 2 and 3 are taken to respective input terminals, denoted by RL and RRL.

An isolation circuit portion 13 is interposed between the output nodes SAOUT, NOTSAOUT and the circuit legs 2, 3 to close a connection during the equilibration phase and open the connection during the sensing phase. The circuit portion 13 comprises a pair of PMOS transistors I38 and I39 having their respective gate terminals in common and their drain terminals respectively connected to the reference leg and the matrix leg. The gate terminals also receive a signal ISOLATE.

Coupled to each of the transistors I38 and I39 are respective NMOS transistors I201 and I202 having their gate terminals in common with the source terminals of the second pair of NMOS transistors I46 and I47 in the latch circuit 11. A signal SENSE is applied to the gate terminal of each of the transistors I201, I202 via an inverter I203. A signal NOTSENSE will therefore appear downstream of the inverter I203.

Thus, in accordance with the invention, the latch circuit 11 and equilibration device will be respectively powered on and off by respective, suitably timed discrete signals SENSE and NOTEQUIL.

Also provided is a restore circuit portion 14 which is connected in the amplifier 1 between the isolate portion 13 and the terminals RL and RRL.

This circuit portion 14 supplies the current flows from the input terminals RL and RRL during the read phase and after the operation of portion 13. It can be seen from FIG. 2 that the restore circuit portion 14 comprises just one pair of PMOS transistors I81 and I82 having respective gate terminals in common and receiving a signal NOTRESTORE. The source terminals of the transistors I81 and I82 are connected to the supply voltage reference Vdd. The drain terminal of the transistor I81 is connected to the reference circuit leg 2, while the drain terminal of the transistor I82 is connected to the matrix circuit portion 3.

The amplifier 1 comprises a circuit portion 15 for biasing the input terminals RL and RRL. This portion 15, also referenced CASCODE, comprises a pair of identical transistors I34 and I36 which are NMOS transistors in this case. The first transistor I34 of this pair is series connected in the reference leg 2, while the second, I36, of these transistors is series connected in the other or matrix leg 3. The gate terminals of the transistors I34 and I36 are connected together, and receive an identical signal VREF corresponding to a stable voltage reference.

The structure of the inventive amplifier is completed by a clamp circuit portion 16, which only becomes active when the inputs RL and RRL are not connected to the elements, namely the reference cell and matrix cell, whose currents are to be compared. In essence, the portion 16 will be active when the column decoding is inactive.

This circuit portion 16 comprises two pairs of transistors I120, I121 and I122, I123 which are all of the NMOS type. The first transistor pair I120, I121 have their gate terminals connected in common to receive an enable signal CLAMP. The drain terminal of the transistor I120 is connected to the input terminal RL, while the drain terminal of the transistor I121 is connected to the input terminal RRL. The transistor I122 is connected in series with the transistor I120 to a voltage reference, such as a ground reference GND. This transistor is in diode configuration. The transistor I123 is connected in series with the transistor I121 to the ground GND. This transistor also is diode connected.

The operation of the sense amplifier according to the invention will now be described.

At the start of a read cycle, the signal SENSE is at a logic low and the circuit 11 is held in an inactive state, thereby holding high the potential at the common sources of the second pair of NMOS transistors, I46 and I47. This is permitted by the signal NOTSENSE downstream of the inverter I203.

Under this condition, the output nodes SAOUT and NOTSAOUT would be connected together by the equilibration transistor I55.

Upon activation of the decode phase, the signal CLAMP goes to a low logic value, thereby releasing the clamp circuit 16.

One of the two input terminals, e.g., the terminal RRL, is connected to a memory element, such as a bit line of a matrix of flash cells. The other input terminal, i.e., the terminal RL in this example, is connected to a generator of a reference current. The two currents that begin to flow along the matrix and reference legs, through the terminals RRL and RL, will be designated Icell and Iref hereinafter.

As first approximation, the resistance of the equilibration transistor can be considered to be zero. A value R, never to be exceeded by this resistance, will be specified hereinafter.

In this situation, the two PMOS transistors I51 and I52 of the circuit 11 are connected like two diodes in parallel, each providing a current I given as:

$$I = (Icell + Iref)/2 \qquad (1)$$

The voltage values at the output nodes SAOUT and NOTSAOUT are in the following relation:

$$V(SAOUT) = V(NOTSAOUT) = Vdd - Vsd \qquad (2)$$

where, Vsd is the source-drain voltage drop across the transistors I51, I52 in diode configuration.

Figure 3:
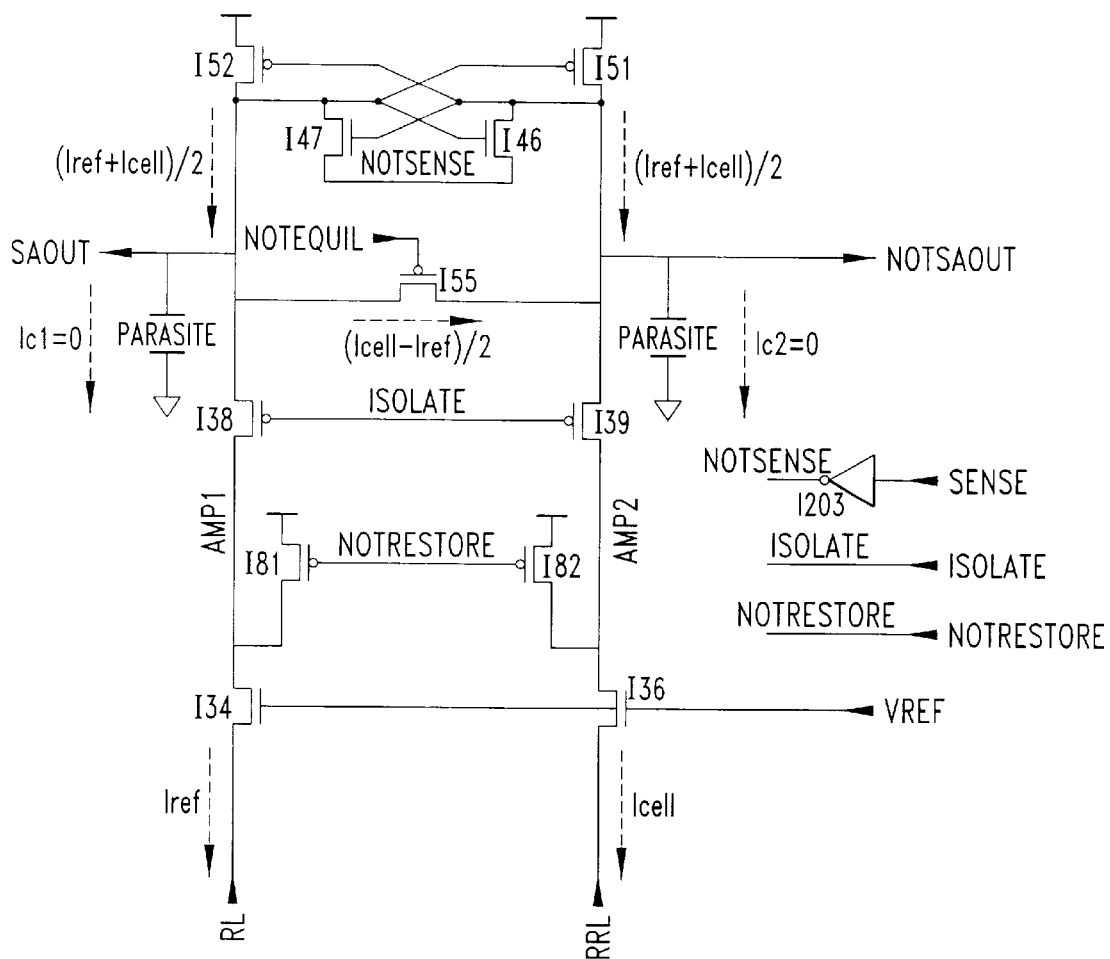
FIGS. 3 and 4 are schematics respectively showing an equivalent circuit of the amplifier of FIG. 1 in two different conditions of its operation.

The accompanying FIG. 3 shows schematically an equivalent circuit of the inventive amplifier in the conditions of operation described hereinabove.

By applying Kirchoff's Laws to either of the output nodes, SAOUT or NOTSAOUT, it can be shown that the current Ieq flowing through the equilibration transistor I55 is:

$$Ieq=(Icell-Iref)/2 \qquad (3)$$

In response to a logic level transition of the signal NOTEQUIL, the equilibration transistor I55 is turned off, and the comparison phase is started between the currents flowing along the two amplifier legs.

Figure 4:
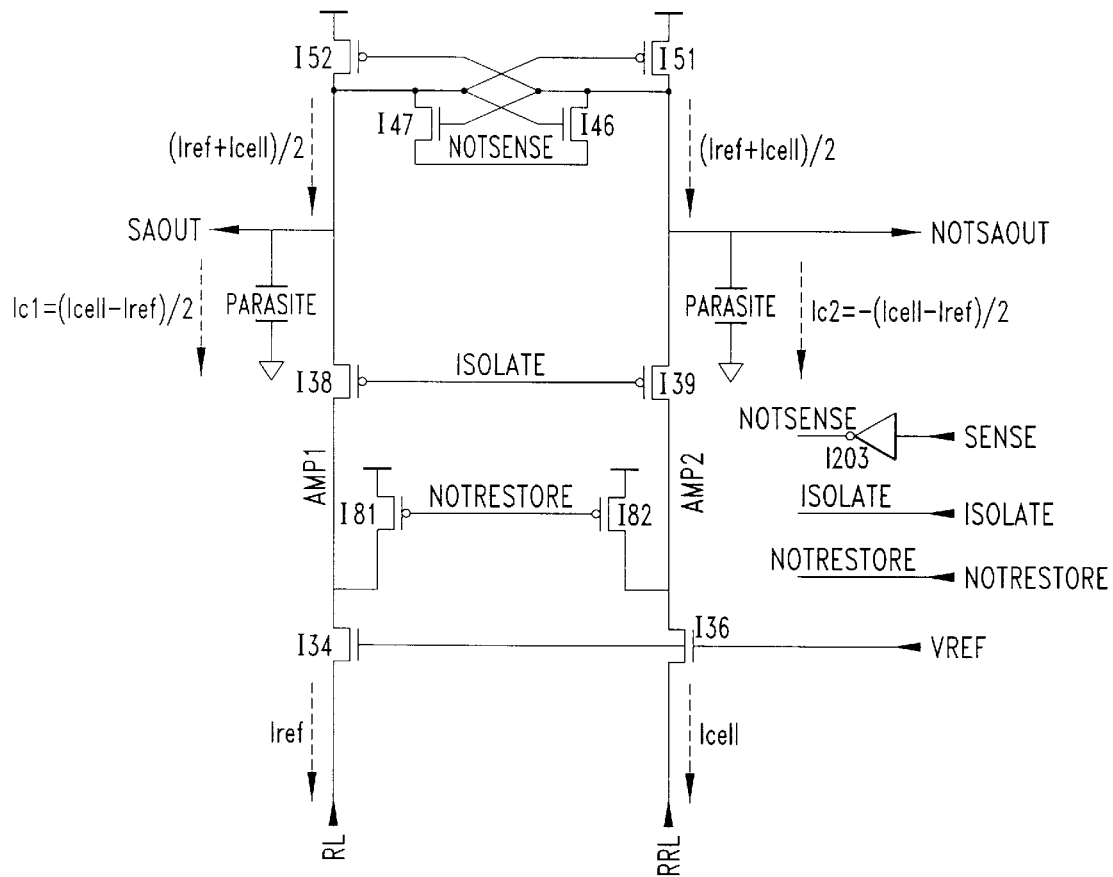

Shown in the accompanying FIG. 4, is an electric diagram of an equivalent amplifier circuit at the beginning of this comparison phase. As can be seen, the transistor I55 has been removed because it is in an inactive state. The absence of a current through the transistor I55 causes one of the two output nodes to be charged, and the other discharged.

Assuming that there are two parasitic capacitances C1 and C2 of the same value, each connected to a respective one of the output nodes SAOUT and NOTSAOUT, the initial values of the currents through these capacitances are given by Kirchoff's Laws as:

$$Ic1=(Icell+Iref)/2-Icell=-(Icell-Iref)/2 \qquad (4)$$

$$Ic2=(Icell+Iref)/2-Iref=(Icell-Iref)/2 \qquad (5)$$

Therefore, the slopes of the two voltage signals at the output nodes SAOUT and NOTSAOUT, just at the beginning of the comparison phase, will be:

$$dV(SAOUT)/dt=(Icell-Iref)/2C \qquad (6)$$

$$dV(NOTSAOUT)/dt=-(Icell-Iref)/2C \qquad (7)$$

The slope of the differential signal [(V(SAOUT)-V(NOTSAOUT)] will be:

$$dV/dt=dV(SAOUT)/dt-dV(NOTSAOUT)/dt=(Icell-Iref)/C \qquad (8)$$

which can be defined as the derivative of the differential voltage at the beginning of the compare phase.

After the separation of the two circuit legs 2 and 3, the current provided to the falling voltage output node decreases, whereas the current provided to the rising voltage node increases.

This positive feedback phenomenon, due to the configuration of the latch circuit 11, causes the derivative of the differential voltage to increase throughout the duration of the compare phase, until the differential voltage between the output nodes becomes large enough to switch one of the two NMOS transistors in the latch circuit 11.

In other words, at the start of the comparison phase, the circuit is left in a state of unstable equilibrium, and the unbalance of the reference and matrix currents urges the system into one of the two stable states allowed.

A predetermined time after the comparison phase is begun, the signal SENSE goes to a logic high, thereby starting the sensing phase.

In response to the rising edge of the signal SENSE, the signal NOTSENSE goes low, activating the two NMOS transistors I46 and I47 of the circuit 11 and turning off the two transistors I201 and I202 included in the isolation circuit portion 13. Simultaneously therewith, the signal ISOLATE will go to a logic high, opening the connection between the output nodes of the sense amplifier and the two circuit legs 2 and 3.

In this condition, the circuit 11 is free to assume either one of the logic states allowed, thereby providing a full CMOS level response of the comparison between the currents in the two circuit legs.

Immediately after the rising of the signal ISOLATE, the signal NOTRESTORE goes low opening a new current flowpath to the circuit legs 2, 3 and keeping the amplifier inputs charged to the right voltage level.

After the data from the sense amplifier is transferred to a memory register, not shown because conventional, all control signals are reset in order to restore the circuit to its initial state of equilibrium and initiate a new sensing cycle.

It can be appreciated from the above considerations that the amplifier of this invention basically operates in three distinct phases:

equilibration, wherein the sense circuit is inactive;

comparison, wherein a differential voltage is generated between the output nodes SAOUT and NOTSAOUT; and sensing, wherein the differential voltage across the output nodes is measured.

The sensing phase response produces a voltage level which is quite compatible with the levels of the CMOS signals.

There remains to be added, for completeness' sake, that for the inventive amplifier to perform satisfactorily, the internal resistance of the equilibration device should be a calibrated value.

Considering the value of the current that is flowing through the transistor I55 during the equilibration phase, it can be seen that it provides an initial static differential signal which is consistent with the anticipated differential voltage.

In other words, once the equilibration phase is completed, the system is left in a state close to the point of unstable equilibrium but slightly shifted toward one of the two stable states.

Figure 5:
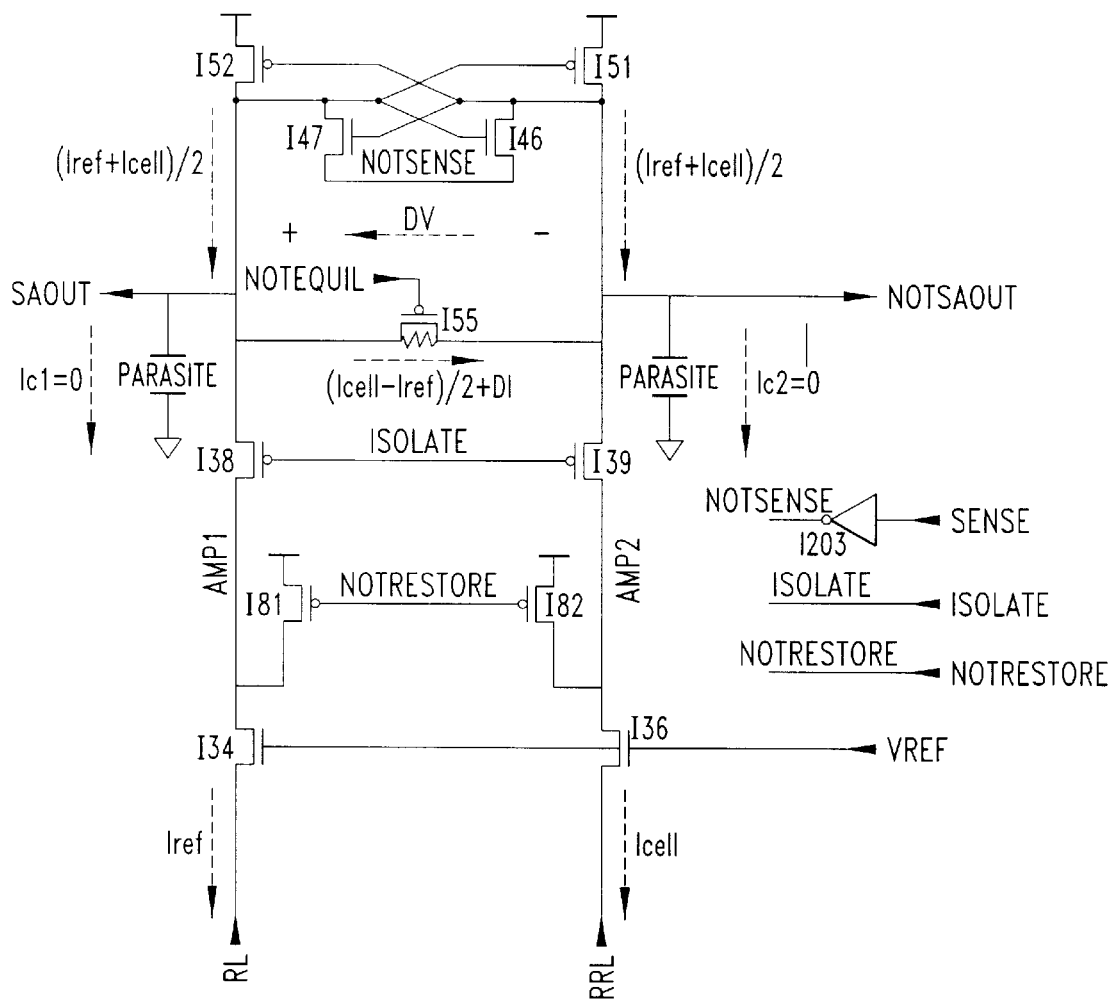
FIG. 5 corresponds to FIG. 2, but brings out a detail of the circuit structure of the amplifier according to the invention.

Reference can be had in this respect to FIG. 5, where the equivalent circuit of the amplifier is represented during the equilibration phase. FIG. 5 basically corresponds to FIG. 2, but highlights the internal resistance R of the transistor I55.

The value of the initial static differential signal can be determined as follows:

$$I1=(Iref+Icell)/2+DI \qquad (9)$$

$$I2=(Iref+Icell)/2-DI \qquad (10)$$

where I1 and I2 are the currents flowing through the two PMOS transistors I51, I52, and DI is:

$$DI=gm*DV/2 \qquad (11)$$

where DV is the static differential voltage between the two output nodes, and gm is the transconductance of the PMOS transistors at the working point given by relation (2).

Kirchoff's Laws give that:

$$Ieq=(Icell-Iref)/2+DI \qquad (12)$$

and, therefore:

$$DV=R*[(Icell-Iref)/2+DI]=R*(Icell-Iref+gm*DV)/2 \qquad (13)$$

R being the resistance of the equilibration device, $$DV=R*(Iref-Icell)/(2-R*gm) \qquad (14)$$

on condition that R*gm<<2, so that the system stability can be guaranteed during the equilibration phase.

Figure 6A:
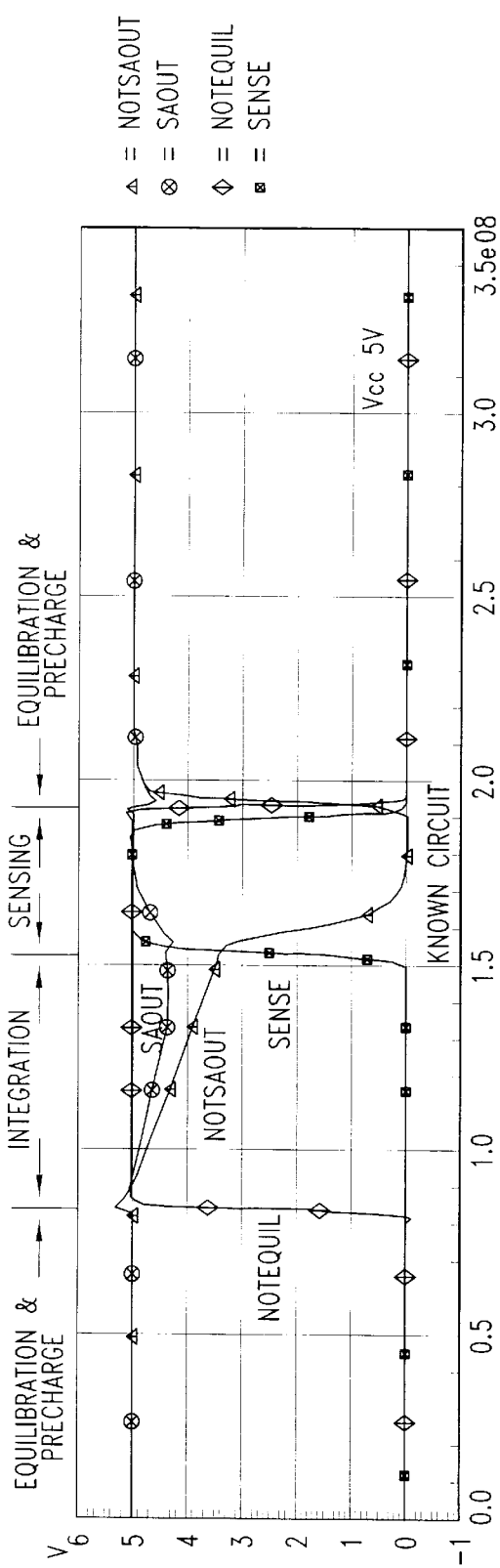
FIGS. 6A, 6B; 7A, 7B; and 8A, 8B are respectively comparative time plots of analog voltage signals appearing in both the sense amplifier of this invention and prior art amplifiers.
Figure 6B:
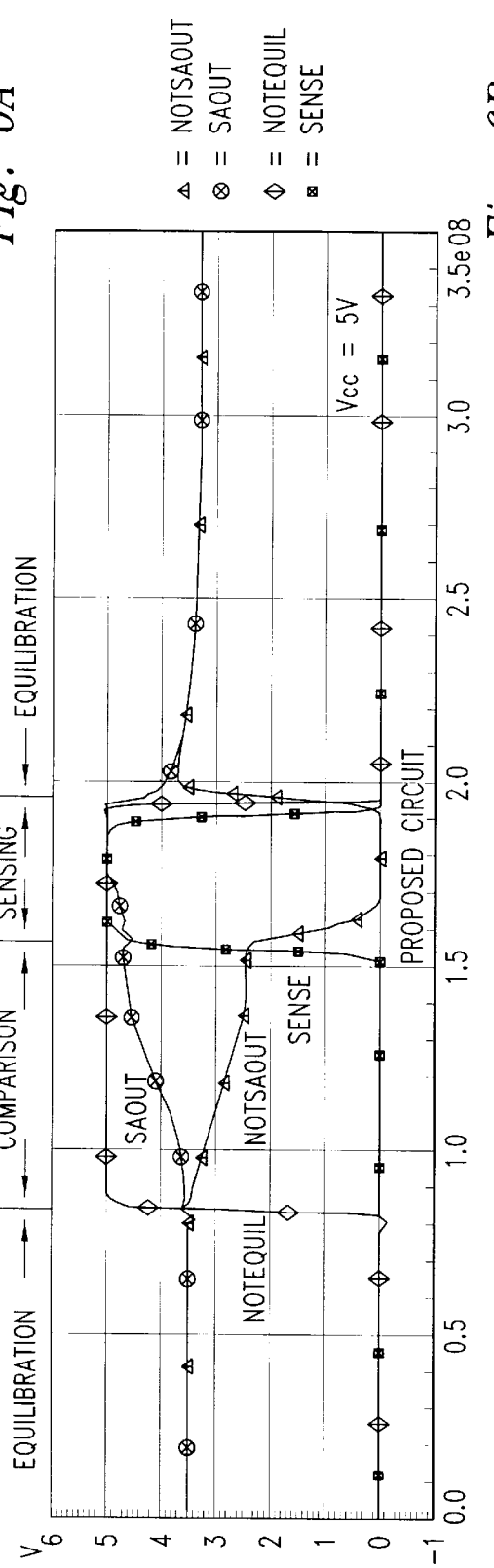

FIGS. 6A, 6B; 7A, 7B; and 8A, 8B are comparative plots and curves which are characteristic of the inventive amplifier operation, as well as of prior art amplifiers.

FIG. 6A shows signals in a prior art sense amplifier showing voltage on the Y axis and relative time on the X axis. The Vcc for this sense amplifier is 5 volts. During the equilibration and precharge stage, the signals SAOUT and NOTSAOUT are charged to 5 volts. After the signal NOTE-QUAL goes high, the integration section begins, where both the signals SAOUT and NOTSAOUT fall from their charged voltage, although, in this case, the signal NOTSAOUT discharges faster than SAOUT. A SENSE signal defines the start of the sensing stage where data is read by the amplifier. Following the data being sensed, the cycle repeats itself with the signals SAOUT and NOTSAOUT returning to their beginning voltages of 5 volts, in an equilibration and precharge stage.

FIG. 6B shows signals in the sense amplifier of the inventive circuit. One of the differences between the prior art amplifier and the inventive amplifier is that the signals SAOUT and NOTSAOUT are equilibrated at a voltage of roughly 3.5 volts, although Vcc is still at 5 volts. At the beginning of this comparison stage, the signal SAOUT increases toward 5 volts, while the signal NOTSAOUT decreases toward 0 volts. Shortly after the voltage difference between SAOUT and NOTSAOUT is large enough to turn on a transistor in the circuit 11, the signal SENSE goes high, starting the sensing stage. During this sensing stage, the signal SAOUT increases until it reaches 5 volts while the signal NOTSAOUT decreases until it reaches 0 volts following the sensing stage. The signals SAOUT and NOTSAOUT are again equilibrated at around 3.5 volts to begin another cycle.

FIGS. 6A and 6B show that the inventive circuit can be used with the existing timing parameters of the prior art.

Figure 7A:
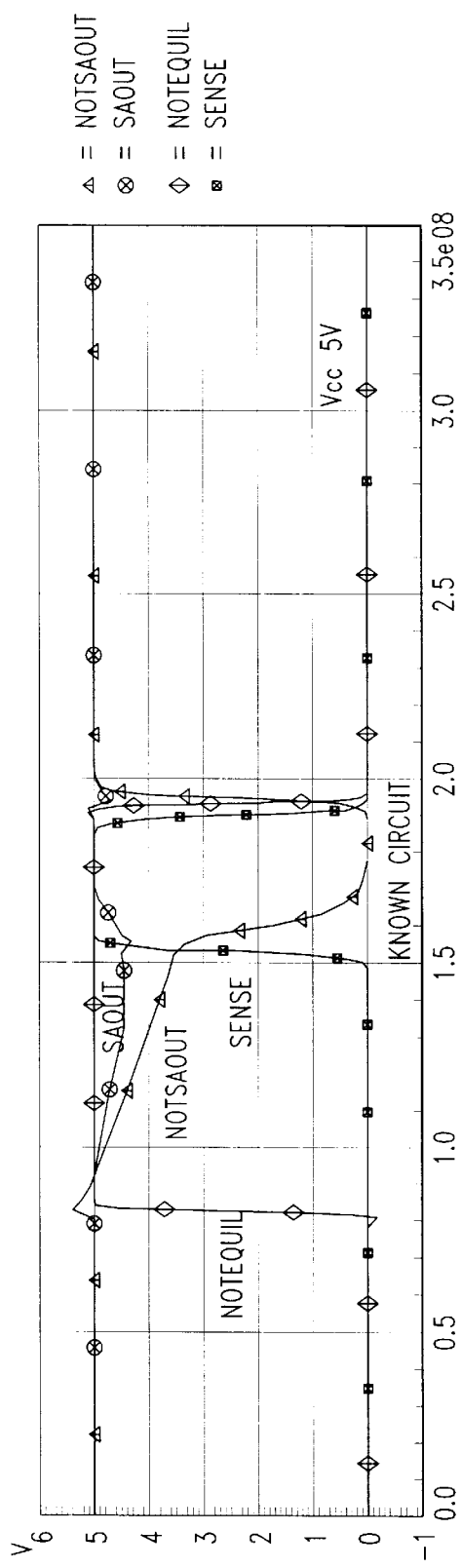
Figure 7B:
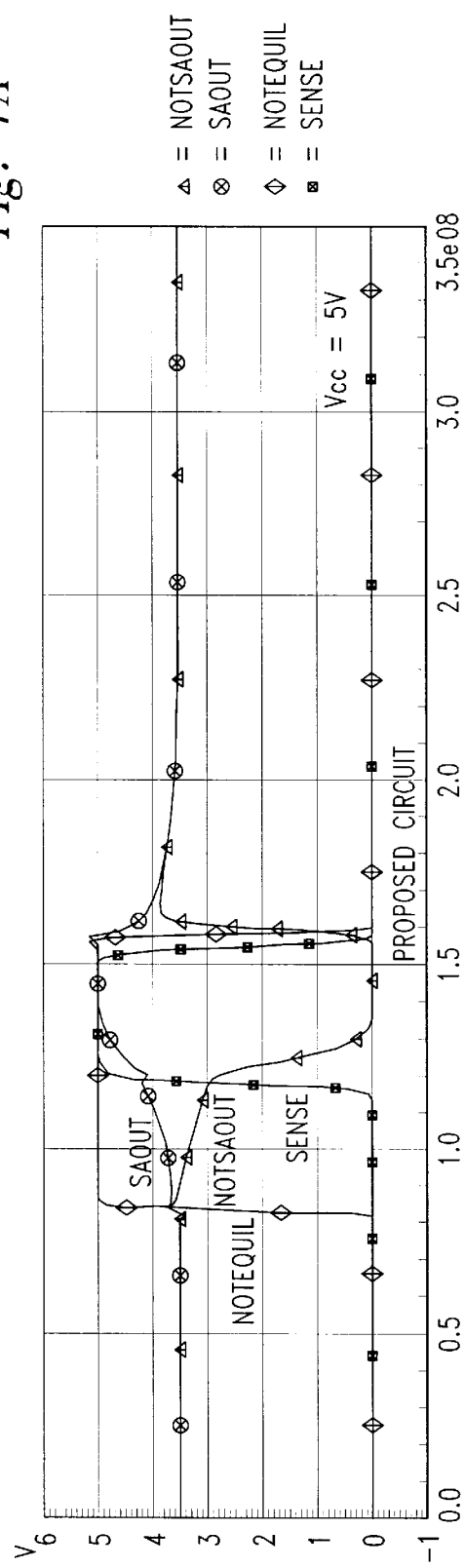

FIG. 7A shows the same signals at the same level as in FIG. 6A. However, in FIG. 7B, the sense signal of this embodiment of the invention fires earlier than in the prior art. In the prior art, the sense signal does not fire until around 1.5 while the sense signal of the inventive circuit can fire at about 1.15. This allows the inventive circuit to sense the data and move into the equilibration stage almost 20% faster than the prior art.

FIGS. 8A and 8B show that the same gains in speed occur even if the Vcc of the circuits is 3.3 volts. In this embodiment, the prior art circuit still equilibrates the signals SAOUT and NOTSAOUT at the Vcc voltage of 3.3 volts, while the inventive circuit places these voltages at around 1.9 and around 1.8, respectively. The speed gains in this circuit are similar to those seen in FIGS. 7A and 7B.

From these graphs, the behaviors in various operational conditions of the main electric signals present in the amplifier 1 can be appreciated. A comparison with the behaviors of similar signals present in known circuits brings out that the amplifier of this invention provides a uniquely fast response in the sensing phase.

In the amplifier of this invention, the value of the output differential voltage is, during the compare phase, a time function that increases with the derivative. Accordingly, the value of the derivative of the output differential voltage increases rapidly during the compare phase, when this differential voltage signal reaches the threshold voltage of one of the NMOS transistors of the circuit 11.

In prior art circuits, for example EP 0 713 222 previously cited and incorporated, the derivative of the differential voltage remains constant during the integration phase. In addition, if the parasitic capacitances are equivalent at the two output nodes, the initial value of the derivative of the differential voltage of the circuit according to the invention will equal the constant value of the derivative of the voltage generated in the prior art circuit during the integration phase. It is readily concluded from these considerations that an amplifier according to the invention can attain a significant differential voltage value within a shorter time than the times taken by prior art circuits.

Further, the generation of the differential voltage is effected starting from a lower DC voltage level than in prior art circuits. This enables the structure of the circuit 11 to reach a stable state, in response to the rising edge of the signal SENSE, at a faster rate.

For all these reasons, the duration of the sense phase of an amplifier according to the invention can be approximately 50% shorter than that of conventional amplifiers.

In prior art circuits, particularly that disclosed by previously cited and incorporated European Application No. 0 713 222, noise may appear on the reference signal VREF during the integration phase. This can be a problem because this signal is used as a reference voltage in other circuit portions of the memory.

No such problem would be encountered with the amplifier of this invention, since a balanced separation exists between the two output nodes SAOUT and NOTSAOUT during the phase of comparing the currents in the matrix leg and the reference leg.

Another advantage is that the use of the clamp circuit 16 ensures proper biasing of the input legs RL and RRL even when the connection of these legs to the reference current generator and the memory element is disabled.

What is claimed is:

1. A dynamic sense amplifier, particularly for semiconductor memory devices of the EPROM, EEPROM and Flash-EEPROM types, which comprises:
   a virtual ground sense circuit having a pair of input nodes and a pair of output nodes;
   an equilibration device structured to accept an equilibration signal and equalize voltages at said output nodes in response to the equilibration signal;
   respective reference and matrix circuit legs associated with said output nodes and coupled to the respective input nodes of the virtual ground sense circuit; and
   a clamping circuit structured to alternately couple the reference and matrix circuit legs to a ground voltage or to couple the reference and matrix circuit legs, respectively, to a reference and a memory cell, in response to a clamp signal;
   wherein said clamp signal is changed prior to the equilibration signal being changed such that the virtual ground sense circuit is coupled to the reference and to the memory cell at its input nodes for a period of time while the output nodes are equalized.

2. The amplifier according to claim 1 wherein said equilibration device is a PMOS transistor having its conduction terminals connected to said output nodes and having a gate terminal that receives the equilibration signal.

3. The amplifier according to claim 1 further comprising a bias circuit portion for biasing said input terminals, wherein said bias circuit portion comprises a pair of identical transistors, of which a first is series connected in the reference circuit leg and the second is series connected in the matrix circuit leg, gate terminals of said identical transistors being connected together to receive the same voltage-stable reference signal.

4. The amplifier according to claim 1, further comprising a reset circuit portion connected to the reference and matrix circuit legs to restore currents flowing from the input nodes.

5. The amplifier according to claim 1 wherein the virtual ground sense circuit is a latch formed of two cross-coupled transistor pairs, and that a switching of the clamp signal initiates a phase of comparing the currents in said reference and matrix legs by an increase of the differential current at the input nodes throughout the comparison period until a related differential voltage at the output nodes reaches a threshold value of at least one of the transistors of the virtual ground sense circuit.

6. A sense amplifier in a memory device comprising:

a sense circuit having a first and a second output node and a first and a second input node, the sense circuit structured to produce a differential voltage signal on the output nodes related to signals present on the input nodes, the differential voltage signal produced after a sensing signal is received at a sensing terminal;

a reference circuit leg coupled to the first input node of the sense circuit and switchably coupled to a reference signal;

a matrix circuit leg coupled to the second input node of the sense circuit and switchably coupled to one of a plurality of memory cells of a memory cell matrix within the memory device;

a clamping circuit coupled to the reference circuit leg and to the matrix circuit leg, the clamping circuit structured to, responsive to a clamping signal, couple the circuit legs to a reference voltage;

wherein the sensing signal and the clamping signal do not change simultaneously.

7. The sense amplifier of claim 6 wherein the sensing terminal is coupled to an equilibration circuit that is in turn coupled to the sense circuit.

8. The sense amplifier of claim 7 wherein the equilibration circuit is a PMOS transistor coupled between the first and second output nodes.

9. The sense amplifier of claim 6 further including an isolation circuit coupled to the reference circuit leg and the matrix circuit leg, the isolation circuit operable, when a signal is received, to disconnect the reference circuit leg from the first input node and to disconnect the matrix circuit leg from the second input node.

10. The sense amplifier of claim 6 further comprising a bias circuit portion for biasing said input terminals, wherein said bias circuit portion comprises a pair of identical transistors, of which a first is series connected in the reference circuit leg and the second is series connected in the matrix circuit leg, gate terminals of said identical transistors being connected together to receive the same voltage-stable reference signal.

11. The sense amplifier of claim 6 wherein the clamping circuit operates only when the sense circuit is disconnected from the reference circuit leg and the matrix circuit leg.

12. The sense amplifier of claim 6 wherein the sense circuit comprises a latch having a first transistor pair and a second transistor pair in a cross-coupled configuration.

13. A method of sensing data from a semiconductor memory using a sense amplifier having a first input node coupled to a reference leg and a second input node coupled to a matrix leg, the method comprising:

equilibrating the reference leg and the matrix leg;

equilibrating a first and a second output node of the sense amplifier;

providing a signal to end equilibration of the reference leg and the matrix leg;

within the sense amplifier, begin comparing a first comparison signal on the reference leg to a second comparison signal on the matrix leg, while the output nodes are still equilibrated; and providing a second signal to end equilibration of the first and second output nodes of the sense amplifier.

14. The method of claim 13 further comprising continuing comparing the first comparison signal on the reference leg to the second comparison signal on the matrix leg after providing a second signal to end equilibration of the first and second output nodes of the sense amplifier.

15. The method of claim 13 wherein the signal provided to end equilibration of the reference leg and the matrix leg is provided to a terminal on a clamping structure coupled to the sense amplifier.

16. The method of claim 13 wherein the signal provided to end equilibration of the first and second output nodes of the sense amplifier is provided to a control terminal of a PMOS transistor coupled between the first and second output nodes.

* * * * *